(12) United States Patent
Swanson et al.

(10) Patent No.: US 6,362,065 B1
(45) Date of Patent: Mar. 26, 2002

(54) BLOCKING OF BORON DIFFUSION THROUGH THE EMITTER-EMITTER POLY INTERFACE IN PNP HBTS THROUGH USE OF A SIC LAYER AT THE TOP OF THE EMITTER EPI LAYER

(75) Inventors: Leland S. Swanson, McKinney; Gregory E. Howard, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/794,709

(22) Filed: Feb. 26, 2001

(51) Int. Cl.[7] .............................................. H01L 21/330
(52) U.S. Cl. ...................... 438/344; 257/198; 438/343; 438/344; 438/345
(58) Field of Search .......................... 257/198; 438/416, 438/344

(56) References Cited

U.S. PATENT DOCUMENTS

| | | | |
|---|---|---|---|
| 4,161,743 A | * 7/1979 | Yonezawa et al. | ............. 357/54 |
| 5,225,371 A | 7/1993 | Sexton et al. | |
| 5,352,912 A | 10/1994 | Crabbe et al. | |
| 5,365,077 A | * 11/1994 | Metzger | ...................... 257/15 |
| 5,496,746 A | * 3/1996 | Matthews et al. | ........... 438/350 |
| 5,691,546 A | * 11/1997 | Morishita | ..................... 257/19 |
| 5,810,924 A | 9/1998 | Legoues et al. | |
| 5,912,481 A | * 6/1999 | El-Sharawy et al. | ........ 257/198 |
| 6,049,098 A | 4/2000 | Sato | |
| 2001/0003667 A1 | * 6/2001 | Ahn et al. | ................... 438/344 |

* cited by examiner

Primary Examiner—David Nelms
Assistant Examiner—Thao P. Le
(74) Attorney, Agent, or Firm—Gerald E. Laws; W. James Brady, III; Frederick J. Telecky, Jr.

(57) ABSTRACT

The present invention relates to a method of forming a bipolar transistor or a heterojunction bipolar transistor. The method comprises forming a collector region associated with a semiconductor substrate, and forming a base region base region over at least a portion of the collector region. The method further comprises forming a diffusion blocking layer over the base region, and forming an emitter polysilicon region over the diffusion blocking layer. The diffusion blocking layer reduces an amount of diffusion from the emitter polysilicon region into the base region, thereby allowing improved process control and emitter/base doping profile, leading to improved transistor performance. In addition, the present invention relates to a heterojunction bipolar transistor, and comprises a collector region, and a graded profile SiGe base layer overlying the collector region. The transistor further comprises a diffusion blocking layer overlying the graded profile SiGe base layer, and an emitter layer overlying the diffusion blocking layer. The diffusion blocking layer is operable to retard a diffusion of dopants therethrough from the emitter layer to the graded profile SiGe base layer, thereby allowing for a reduction in the thickness of the layer comprising a graded profile SiGe layer and a buffer layer. The thickness reduction allows increased Ge concentration in the base layer and the emitter/base doping profile is improved, each leading to improved transistor performance.

14 Claims, 11 Drawing Sheets

BLOCKING OF BORON DIFFUSION THROUGH THE EMITTER-EMITTER POLY INTERFACE IN PNP HBTS THROUGH USE OF A SIC LAYER AT THE TOP OF THE EMITTER EPI LAYER

FIELD OF THE INVENTION

The present invention relates in general to the field of integrated circuits, and more particularly to bipolar and heterojunction bipolar transistor structures and a method of fabricating such structures.

BACKGROUND OF THE INVENTION

Bipolar transistors are important components in, for example, logic circuits, communications systems, and microwave devices. A bipolar transistor is essentially a three terminal device having three regions, an emitter, base and collector region, wherein the emitter and collector regions are of one conductivity type and the base is of another.

Since the advent of bipolar transistors, many attempts have been made to improve the performance of the transistor. Some of these attempts have focused on increasing the current gain by improving the injection efficiency of the minority carriers from the emitter to the base. In order to accomplish this, wide bandgap transistors have been fabricated wherein the bandgap of the emitter is wider than the bandgap of the base. A wide bandgap transistor has been constructed in a variety of fashions, and one such transistor structure is referred to as a heterojunction bipolar transistor.

For example, in one type of heterojunction transistor, a transistor is formed with a silicon collector region, a base region composed of a silicon-germanium (SiGe) alloy, and a silicon emitter region. The mixed crystal semiconductor base layer may have a uniform distribution of germanium in silicon or may contain a graded distribution of germanium in the silicon. The graded SiGe distribution is provided in order to increase the bandgap of the transistor. With the above described structure of a wide bandgap transistor and the fact that germanium has a large electron mobility, performance of the transistor is enhanced.

A brief explanation of how the SiGe base region enhances transistor performance is provided briefly below. Graded junctions are used in solid state transistors to enhance device performance. The application of a graded junction in the base region of a bipolar transistor, for example, results in the formation of a nonuniform energy gap. A graded bandgap can be employed to reduce base transit time and thus increase the device speed. More particularly, the bandgap of silicon can be varied by the introduction of dopants, the formation of alloys (e.g., SiGe), and/or the introduction of strain into the crystal lattice. Combinations of all three of these phenomena have been used to produce very high speed graded SiGe-base heterojunction bipolar transistors. In addition, such graded profile heterojunction transistors may exhibit additional advantages over conventional silicon devices for high speed digital and microwave devices, for example, by providing higher emitter injection efficiency, lower base resistance, lower base transit times, and superior low temperature speed and gain.

Many attempts in further improving heterojunction bipolar transistor performance have focused on, for example, decreasing the width of the base region of a transistor and decreasing the base transit time for a constant base width. Nevertheless, accomplishing such a base thickness reduction has proved difficult for a variety of technical reasons. For example, anneal processes involved in polysilicon type emitter PNP bipolar devices may result in the P-type emitter dopant (e.g., boron) diffusing into the base region. To mitigate the negative impact of such diffusion, an intrinsic silicon buffer layer is typically added to the graded profile base region to prevent such diffusion from negatively impacting the SiGe alloy. Such a buffer layer, however, causes the effective emitter/base epitaxy thickness to increase. Therefore, in conventional heterojunction structures and methods, there is a limitation as to how thin the emitter/base epitaxy can be fabricated when the emitter is formed and contacted by polysilicon.

There is a need in the art for improved structures and methods relating to heterojunction bipolar transistors.

SUMMARY OF THE INVENTION

The present invention relates generally to a bipolar transistor structure and a method of making such a structure, which reduces the base transit time and provides for a more abrupt emitter-base junction, and hence higher transition frequency and gain.

The present invention is directed to a heterojunction bipolar transistor structure having a diffusion blocking layer (e.g., a SiC alloy) associated with the emitter/base region of the transistor. The diffusion blocking layer is operable to retard a diffusion of dopants therethrough from the emitter region down to a SiGe graded profile base layer. The reduction in diffusion allows a buffer layer associated with the emitter/base epi region to be reduced substantially, thereby reducing the emitter/base epi thickness. The emitter/base epi thickness reduction advantageously improves transistor performance and reduces the lattice strain in the base, thereby permitting a peak germanium concentration in the SiGe graded profile base layer to be increased, which advantageously increases the transistor speed and/or gain. In addition, the method employs an intrinsic silicon layer over the diffusion blocking layer in the emitter/base epi region to form an oxide which is then removed with a deglaze step. The oxidation and deglaze steps expose the underlying diffusion blocking layer which is not prone to oxidation prior to formation of the emitter, thereby reducing or eliminating an interfacial oxide at the emitter/emitter poly interface and reducing the emitter resistance of the transistor.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
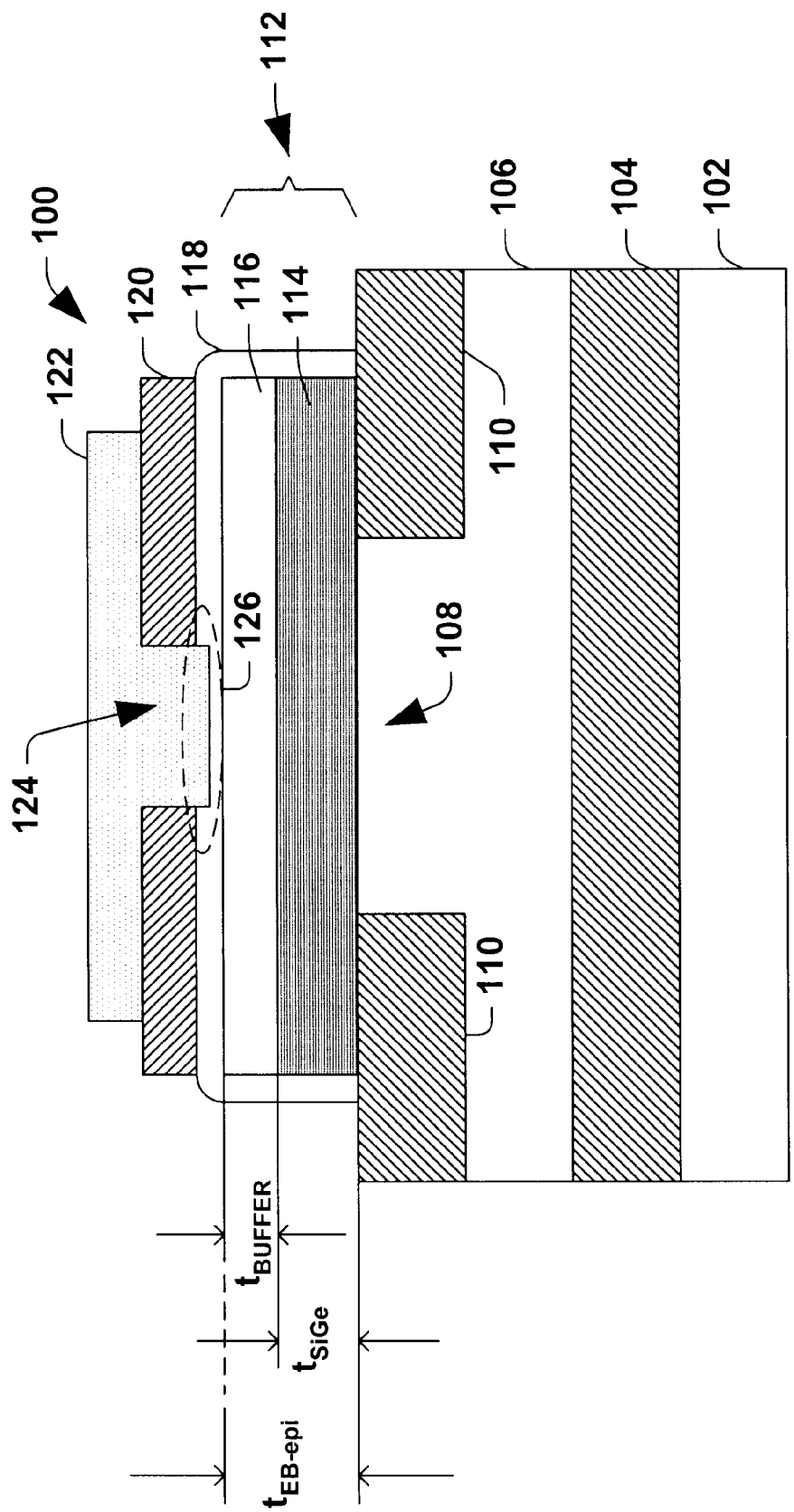
FIG. 1 is a fragmentary cross section diagram illustrating a prior art heterojunction bipolar transistor structure.

The present invention will now be described with respect to the accompanying drawings in which like numbered elements represent like parts.

The present invention is directed to a bipolar or a heterojunction bipolar transistor structure and a method of manufacturing such a structure which exhibits improved transistor performance due to a reduction in the transistor emitter/base epitaxy thickness and a more abrupt emitter/base junction. More particularly, the transistor comprises a diffusion blocking layer associated with the emitter/base epitaxy region which impedes the diffusion of dopants such as boron from the emitter polysilicon down to a graded profile SiGe base layer. The reduction in dopant diffusion allows for a reduction or elimination of a silicon buffer layer associated with the emitter/base epitaxy region, which reduces the emitter/base epi thickness. In addition, the reduction in emitter/base epi thickness reduces strain in the SiGe graded profile base layer, thereby allowing a peak germanium concentration therein to be increased, which provides for an increase in transistor speed and/or gain. The position of the emitter p-n junction is well controlled, providing greater process margin. Higher diffusion temperatures may be used to achieve the desired dopant profile at a higher boron dopant activation. Also, the emitter side of the depletion region is more abrupt therefore yielding a device which has significantly higher gain.

In order to properly understand the various advantageous inventive aspects of the present invention, a brief description of a conventional PNP type heterojunction bipolar transistor structure will be described, along with an exemplary processing methodology discussion where appropriate. A conventional heterojunction bipolar transistor structure is illustrated in prior art FIG. 1, and is designated at reference numeral 100. The transistor 100 is formed on a semiconductor substrate, for example, a lightly doped p-type silicon substrate 102 with an isolation region formed therein, for example, a buried oxide layer 104. A p-type collector region 106 is formed over the buried oxide layer 104, and a collector interface 108 is defined by the formation of laterally spaced isolation regions 110.

An n-type SiGe strain layer (sometimes referred to as an emitter/base layer) 112 is then formed over the collector interface 108. The SiGe strain layer 112 includes, for example, a graded profile SiGe layer 114 and an intrinsic silicon buffer layer 116 thereon. A thin pad oxide adhesion layer 118 overlies the SiGe strain layer 112 and another isolation region, for example, a nitride layer 120 overlies the oxide layer 118. A p-type polysilicon emitter region 122 then makes contact to the SiGe strain layer 112 through a contact region 124 in the isolation layers 116 and 118, respectively.

The conventional heterojunction bipolar transistor structure 100 of prior art FIG. 1 has several drawbacks. Initially, the SiGe strain layer 112 is undesirably thick due to the nature of the structure, and reducing such thickness is prohibitive. The SiGe strain layer 112 has a thickness $T_{EB\text{-}epi}$, which is defined by a SiGe layer 114 of thickness $t_{SiGe}$ and the intrinsic Si buffer layer 116 of thickness $t_{BUFFER}$. The buffer layer 116 serves to accommodate p-type dopant (e.g., boron) which diffuses from the emitter polysilicon 122 into the SiGe strain layer 112 to form the epitaxial emitter 126. Because boron readily diffuses from the polysilicon emitter 122 into the SiGe strain layer 112 during the thermal anneal of the emitter 122, the intrinsic Si buffer layer 116 receives the diffused dopant and prevents such dopant from reaching the SiGe layer 114, wherein such dopant would negatively impact transistor performance. Typically, to prevent boron diffusion down to the SiGe layer 114, the intrinsic Si buffer layer 116 exhibits a thickness ($t_{BUFFER}$) of about 400 Angstroms (e.g., 300–500 Angstroms) or so. Therefore for a SiGe layer 114 having a given thickness (e.g., about 1,300 Angstroms), a buffer layer of about 400 Angstroms or so is required to maintain performance integrity. Since the SiGe strain layer thickness ($t_{EB\text{-}epi}$) is a function of both the buffer layer 116 and the SiGe layer 114 ($t_{EB\text{-}epi} = t_{BUFFER} + t_{SiGe}$), the required buffer layer thickness acts as a limiting factor on decreasing the emitter/base epi thickness.

In addition, the thickness of the intrinsic Si buffer layer 116 limits an amount of lattice mismatch between the bulk Si in the collector and the SiGe layer 114 due to stress issues. Therefore the buffer layer 116 reduces the peak Ge concentration which can be integrated into the SiGe layer 116. As is well known, when forming a layer on another layer which do not have matching crystal lattices (e.g., a Si collector and a SiGe base) a lattice strain will occur. In such a context, there is a critical thickness at which the lattice strain will cause a nucleation of defects in the growing epitaxial layer. These defects will quickly multiply so that the resulting layer will exhibit undesirably high defect levels. If, however, the thickness of the epitaxial layer is less than the critical thickness, there can be a very low defect density in the epitaxial layer.

The critical thickness of the epitaxial layer depends on the degree of lattice mismatch. Therefore for relatively pure Ge grown on Si, which exhibit about a 4% lattice mismatch, only about 5–6 atomic layers of Ge can be formed on the Si. However, in a SiGe alloy for low concentrations of Ge, the critical thickness of the film may be increased since the degree of lattice strain is less. Therefore it can be seen that an inverse relationship exists between the Ge concentration in a SiGe alloy and a critical thickness at which defect density is unreasonably high. Applying this relationship to the structure 100 of prior art FIG. 1, it can be seen that as the SiGe strain layer (emitter/base epi layer) thickness ($t_{EB\text{-}epi}$) is increased due to the necessary buffer layer 116, the Ge concentration in the SiGe layer 114 must be undesirably decreased to avoid an undesirably large defect density therein due to lattice strain. Such a decrease in Ge concentration negatively impacts transistor speed.

In addition to the disadvantages highlighted above, the heterojunction bipolar transistor 100 of prior art FIG. 1 also exhibits an undesirably large emitter resistance due to an oxidation region 126 at the emitter poly/emitter epi layer interface. When forming the transistor 100, the pad oxide adhesion layer 118 is formed over the SiGe strain layer 112 and a nitride layer 120 is then formed on the oxide 118. When defining the emitter contact, the oxide 118 serves as an etch stop, wherein the dry etch is substantially selective with respect to the oxide, thereby allowing an overetch of the nitride 120 to occur without a substantial risk of etching into the buffer layer 116. Although the remaining oxide 118 is subsequently removed, the underlying layer 116 is intrinsic silicon which naturally oxidizes when exposed to various environmental conditions, and forms a thin native oxide (e.g., about 5–10 Angstroms) thereover. This interfacial oxide 126 undesirably results in an increase in the emitter resistance.

Figure 2:
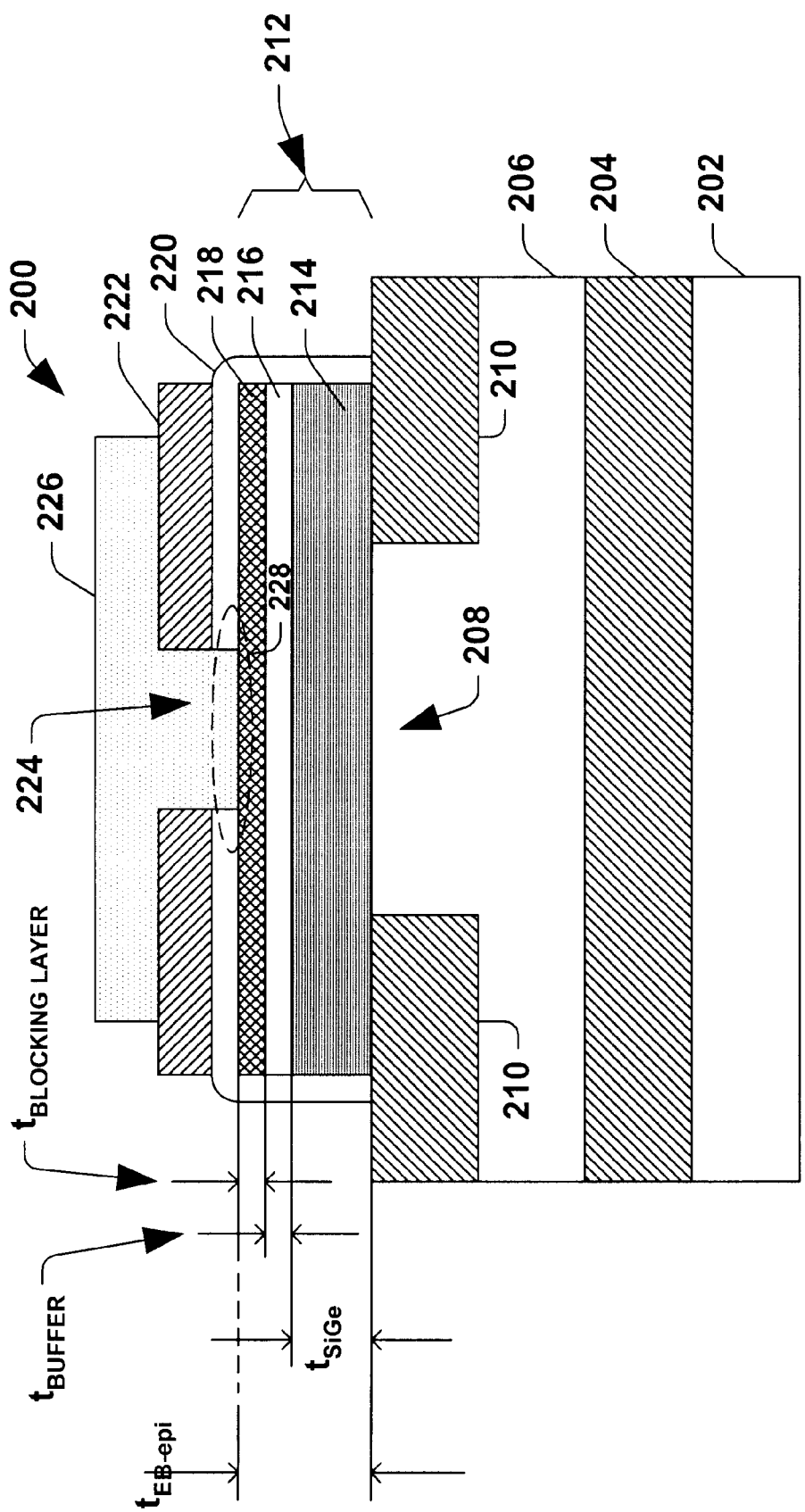
FIG. 2 is a fragmentary cross section diagram illustrating a heterojunction bipolar transistor structure according to one exemplary aspect of the present invention.

Turning now to FIG. 2, a PNP type heterojunction bipolar transistor 200 according to the present invention is disclosed. The transistor 200 comprises a semiconductor substrate, for example, a p-type lightly doped silicon substrate. An isolation region 204, for example, a buried oxide layer is formed in the substrate 202, however, the isolation region 204 is optional for the present invention. A p-type collector region 206 is formed over the isolation region 204. According to one exemplary aspect of the present invention, the collector 206 is initially part of the substrate 202 and is subsequently defined by the formation of the buried oxide layer 204, however, the collector region 206 alternatively may be formed via an epitaxial growth process, as may be desired.

Still referring to FIG. 2, a collector region interface 208 is defined by the formation of laterally spaced isolation regions 210 via, for example, a shallow trench isolation process. A SiGe strain layer (which may alternatively be referred to as the emitter/base epi region) 212 is then formed over the collector region interface 208. According to one exemplary aspect of the present invention, the SiGe strain layer 212 comprises a graded profile SiGe layer 214, an intrinsic Si buffer layer 216 formed thereover, and a diffusion blocking layer 218 formed over the buffer layer 216. Alternatively, the buffer layer 216 may be substantially eliminated with the diffusion blocking layer 218 overlying the SiGe graded profile base layer 214, more directly. As will be discussed in greater detail infra, the diffusion blocking layer 218 advantageously mitigates or altogether eliminates a diffusion of p-type dopant from the emitter to the SiGe base layer 214, thereby allowing for an advantageous reduction in emitter/base epi layer thickness.

A pad oxide adhesion layer 220 is formed over the diffusion blocking layer 218, and a nitride layer 222 is further formed over the oxide 220. Although the isolation layers 220 and 222 may be formed as illustrated, it should be understood that other isolation materials and layer combinations may be utilized in order to define an emitter contact region and any such alternatives are contemplated as falling within the scope of the present invention. An emitter contact region 224 is then defined in the isolation layers 220 and 222 and an emitter region, for example, a doped polysilicon layer 226 is formed thereover, thereby making electrical contact down to the SiGe strain layer 212 via the diffusion blocking layer 218.

The PNP heterojunction bipolar transistor 200 of FIG. 2 advantageously overcomes several of the disadvantages associated with the prior art transistor 100 of FIG. 1. For example, the diffusion blocking layer 218 is operable to retard the diffusion of p-type dopants such as boron from the emitter region 226 to ensure dopants do not reach the SiGe base layer 214 and therefore the thickness of the layer 216 ($t_{BUFFER}$) is substantially reduced or eliminated altogether. For example, the intrinsic Si buffer layer 216 may be reduced from about 400 Angstroms in prior art FIG. 1 to about 50 Angstroms (e.g., about 0–100 Angstroms). Consequently, the SiGe strain layer thickness $t_{EB\text{-}epi}$ is reduced substantially. Clearly, if the diffusion blocking layer 218 is sufficiently effective to completely prohibit diffusion therethrough, the buffer layer 216 may be removed completely, thereby further reducing the SiGe strain layer thickness ($t_{EB\text{-}epi}$).

As may be appreciated, the blocking layer 216 thickness may be a function of the thermal budget of the process, wherein if subsequent processing steps require substantial thermal processing, the blocking layer thickness may need to be increased, and wherein if subsequent steps require lesser amounts (or lesser temperatures) for thermal processing, the blocking layer thickness may be further reduced or eliminated completely.

According to one exemplary aspect of the present invention, the diffusion blocking layer 218 may comprise a silicon-carbon alloy (SiC). For example, the SiC may have a thickness of about 50 Angstroms and have a composition of $Si_{(1-X)}C_X$, wherein X varies between about 0.0001 and about 0.01, and more particularly between about 0.001 to about 0.002. Although the above composition type and relative amount is one example of a diffusion blocking layer which operates to retard or eliminate a diffusion of p-type dopants such as boron therethrough, it should be understood that other materials or alloys may be employed and are contemplated as falling within the scope of the present invention. For example, a SiGe alloy or other suitable type material may be employed to retard diffusion.

Note the diffusion of dopants into the diffusion blocking layer 218 (e.g., the SiC layer) causes the layer 218 to be a part of the emitter (often called the emitter-epi). This phenomena advantageously moves the depletion region away from the emitter polysilicon interface which further improves transistor performance.

As highlighted above, a reduction in the SiGe strain layer thickness ($t_{EB-epi}$) results in less lattice stress and thus permits a higher germanium concentration in the graded SiGe base layer 214 over the conventional structure 100 of prior art FIG. 1. By employing a higher Ge concentration in the SiGe base layer 214, improved transistor speed is attained without sacrificing the quality of the SiGe strain layer 212; that is, the Ge concentration is increased without a substantial increase in defect density therein. According to one exemplary aspect of the present invention, a generally trapezoidal shaped SiGe graded profile base layer 214 may be employed, wherein the Ge concentration increases at a high rate near the collector region interface 208 and gradually decreases in concentration as one traverses the SiGe strain layer 212 vertically toward the emitter-poly region 226.

The transistor structure 200 of FIG. 2 also exhibits reduced emitter resistance over the prior art device 100 of FIG. 1. In the transistor 200, the emitter-poly 226 contacts substantially directly the diffusion blocking layer 218, for example, a SiC alloy. Due to the composition of the blocking layer 218, its surface does not oxidize as readily as the exposed intrinsic Si buffer layer of the prior art, and thus little substantial interfacial oxide forms and resides at the emitter/blocking layer interface 228. What oxide is present is more easily removed in the epi reactor chamber prior to emitter poly deposition. Thus the resistance between the emitter 228 and the SiGe strain layer 212 is reduced substantially.

Figure 3:
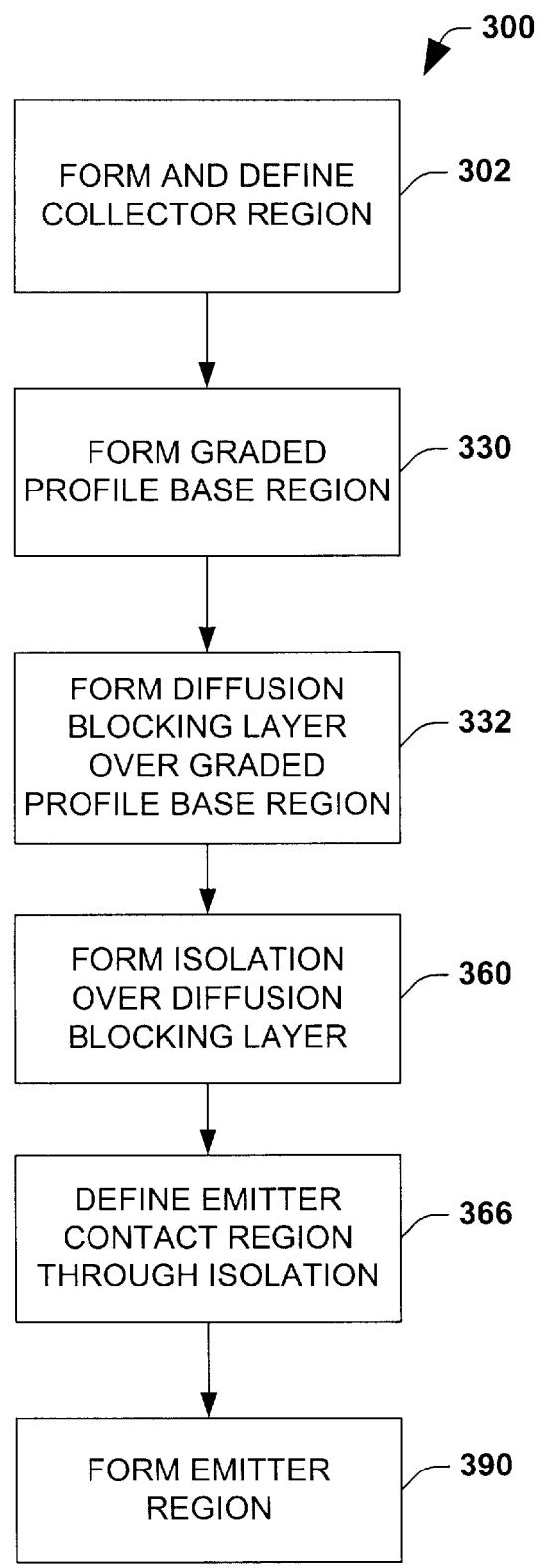
FIG. 3 is a flow chart diagram illustrating a method of fabricating a heterojunction, bipolar transistor structure such as that illustrated in FIG. 2 according to one exemplary aspect of the present invention.

Turning now to FIG. 3, a flow chart diagram is provided which illustrates a method 300 of forming a PNP type heterojunction bipolar transistor having a reduced emitter/base epi thickness according to the present invention. The method 300 of FIG. 3 will be described in conjunction with other figures in order to facilitate a clear understanding of the present invention, however, such accompanying figures are not meant to limit the scope of the invention and should not be interpreted as such. In addition, while for purposes of simplicity of explanation the methodology of FIG. 3 is shown and described in a serial manner, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

Figure 4:
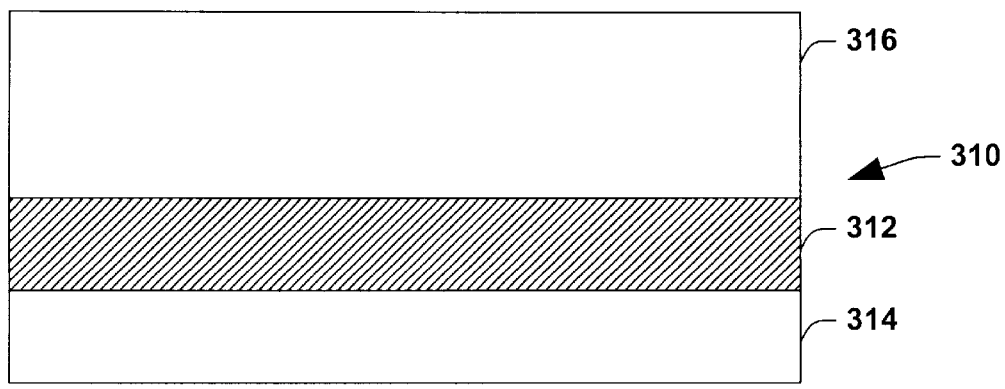
FIG. 4 is a fragmentary cross section diagram illustrating a step of forming a collector region according to the present invention.

The method 300 begins at step 302 with the formation and/or definition of a collector region (e.g., collector region 206 of FIG. 2). For example, as illustrated in FIG. 4, a semiconductor substrate 310 (e.g., a lightly doped p-type Si substrate) has a buried oxide layer 312 formed therein using one of several known, conventional techniques. The formation of the buried oxide layer 312 separates the substrate 310 into two sections, a lower region 314 which acts as the device substrate, and an upper region 316 which defines a lightly doped p-type collector region. The collector region may be subsequently doped to customize the collector dopant concentration if desired.

Figure 5:
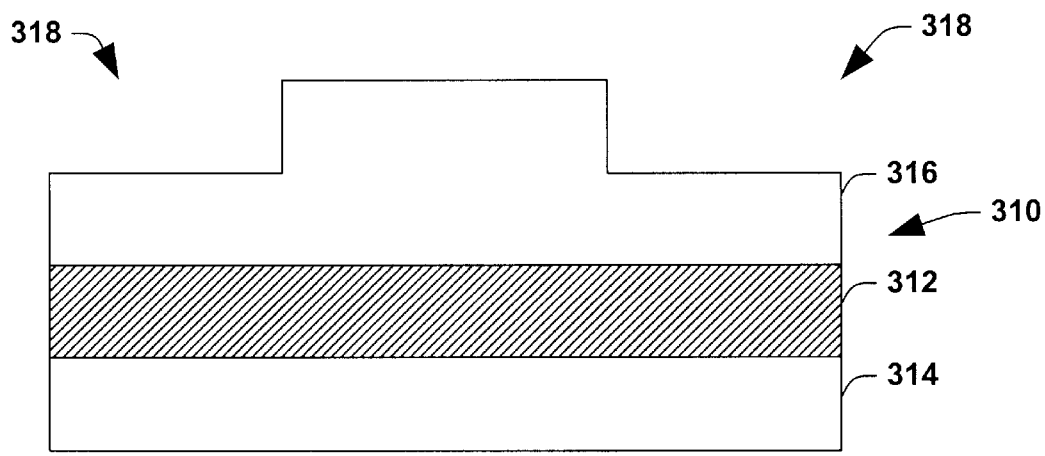
FIG. 5 is a fragmentary cross section diagram illustrating a step of defining collector region interface according to the present invention.
Figure 6:
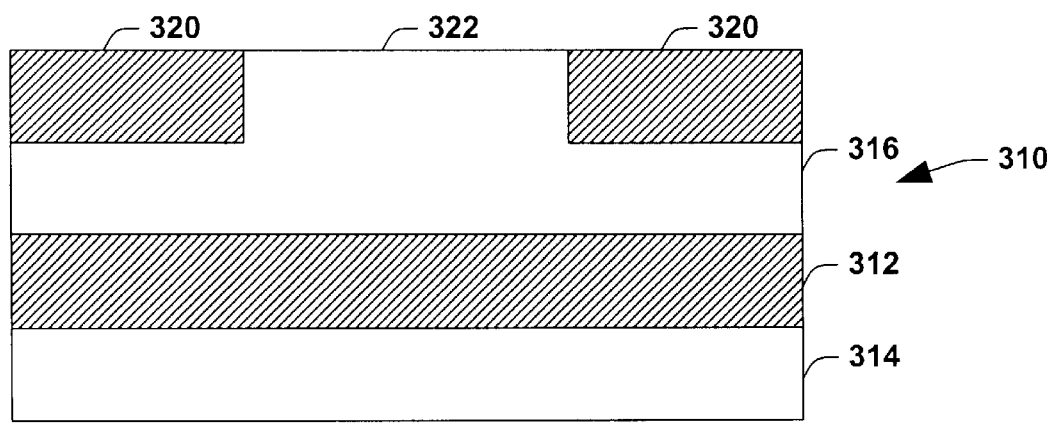
FIG. 6 is a fragmentary cross section diagram illustrating a step of further defining the collection region interface using a shallow trench isolation process according to the present invention.
Figure 7:
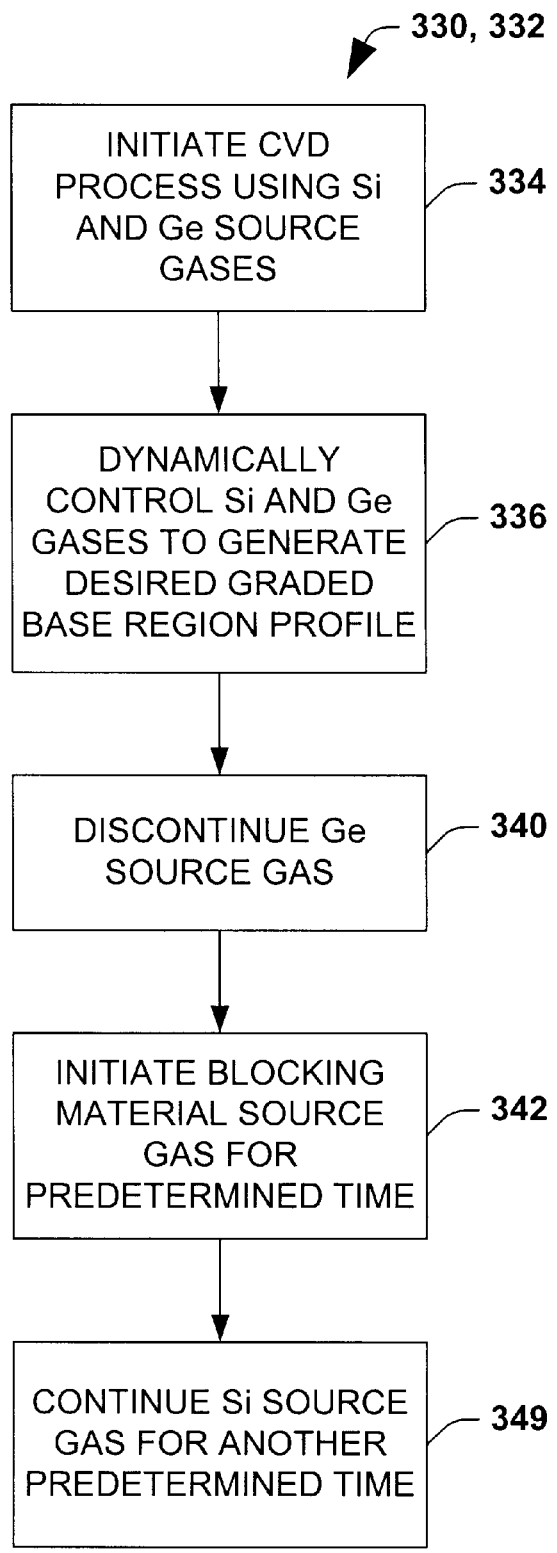
FIG. 7 is a flow chart diagram illustrating a method of forming a graded profile base region and a diffusion blocking layer such as that illustrated in FIG. 2 according to one exemplary aspect of the present invention.

Step 302 continues further by defining the collector region to form a collector interface. For example, as illustrated in FIGS. 5 and 6, a shallow trench isolation process may be employed by anisotropically etching shallow trenches 318 into the collector region 316 using, for example, a dry etch. Subsequently, a chemical vapor deposition step is performed, by which an oxide layer is formed over the substrate 310 and then etched by using either an etch or a chemical-mechanical polishing (CMP) step to substantially planarize the substrate surface, wherein the surface is defined by two laterally spaced isolation regions 320 and a collector interface region 322.

The method 300 of FIG. 3 continues at steps 330 and 332 by forming a graded profile base region (e.g., a portion of the SiGe strain layer 212 of FIG. 2) over the defined collector region and a diffusion blocking layer over the graded profile base region. The graded profile base region and diffusion blocking layer may be formed via numerous techniques and all such techniques are contemplated as falling within the scope of the present invention, however, one exemplary method will be discussed and illustrated in conjunction with FIGS. 7–10.

The formation of the graded profile base region may be formed in accordance with one exemplary aspect of the present invention using a vapor phase epitaxy deposition (VPE) process, however, other processes may be employed (e.g., limited reaction processing (LRP), molecular beam epitaxy (MBE), laser melting, and others) and are contemplated as falling within the scope of the present invention. The VPE process at step 334 is initiated by setting the epi-reactor chamber to a desired chamber pressure (e.g., about 10–20 Torr, or alternatively atmospheric pressure) and activating both silicon and germanium gas sources.

Figure 8:
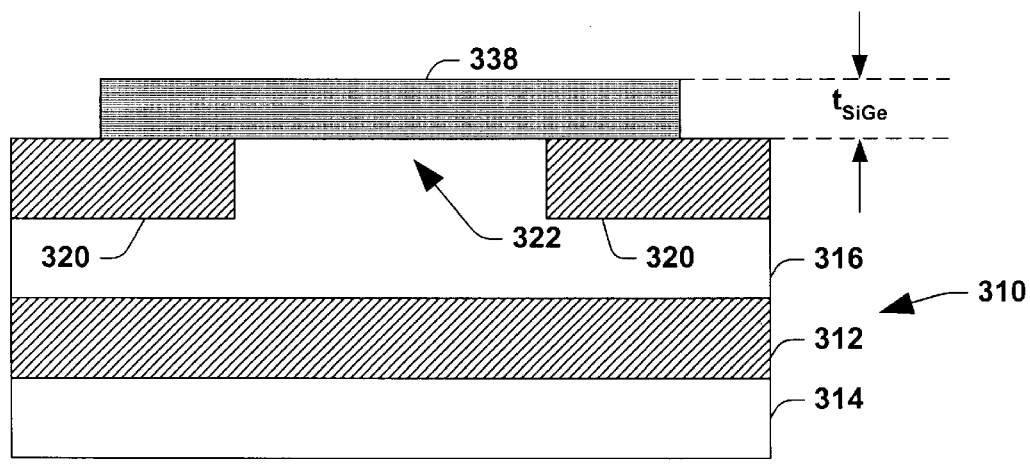
FIG. 8 is a fragmentary cross section diagram illustrating a step of forming a graded profile base layer according to the present invention.

The base layer (e.g., graded profile base layer 214 of FIG. 2) is generated with a graded profile at step 336 by dynamically controlling the Si and Ge source gases so as to introduce a varying Si/Ge ratio as the epitaxial layer grows. For example, step 336 may have a substantially low Si/Ge ratio (indicating a larger Ge concentration) initially and then gradually increase the Si/Ge ratio over time to generate a generally trapezoidal graded profile, wherein a concentration of Ge in the SiGe alloy decreases as the layer is formed. The layer formation process results in a SiGe graded profile base layer 338, as illustrated in FIG. 8 having a thickness $t_{SiGe}$ (e.g., about 1000 Angstroms or less). After a predetermined period of time has elapsed which corresponds to a desired thickness of the SiGe layer, the Ge source is deactivated at step 340.

Figure 10:
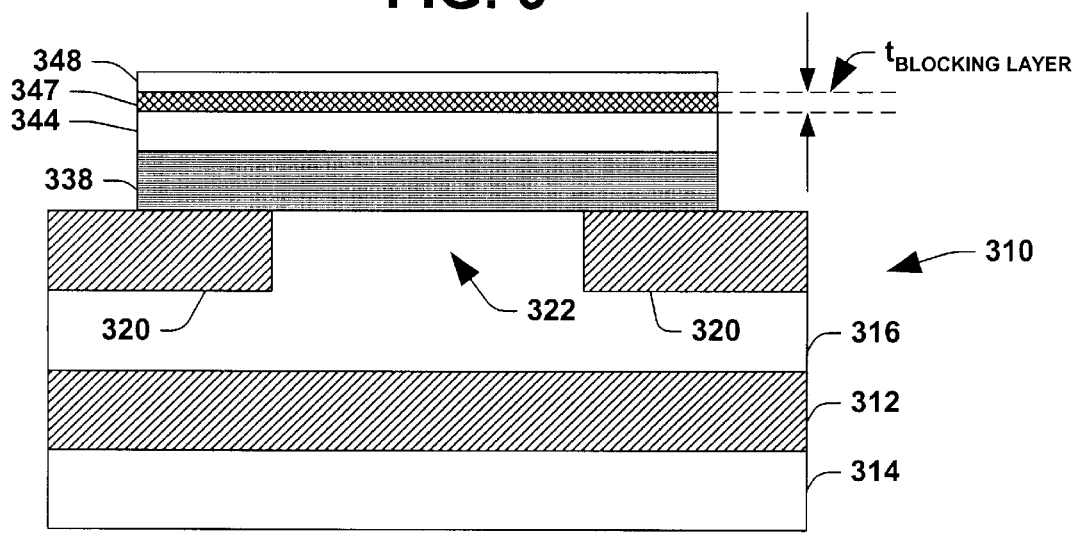
FIG. 10 is a fragmentary cross section diagram illustrating a step of forming an intrinsic silicon layer over the diffusion blocking layer according to the present invention.

The diffusion blocking layer (e.g., layer 218 of FIG. 2) is then formed by initiating a blocking material source gas associated with the VPE process at step 342. According to one exemplary aspect of the present invention, the blocking material source gases are methyl silane and dichlorosilane and/or silane, such that the resulting layer is a SiC alloy. Further, in accordance with one exemplary aspect of the invention, the Si/C source gas ratio is such that the resulting SiC alloy is $Si_{(1-X)}C_X$, wherein X varies between about 0.0001 and about 0.01, and more particularly between about 0.001 and about 0.002. The duration of step 342 is controlled so as to generate a diffusion blocking layer 347 of a predetermined thickness ($t_{BLOCKING\ LAYER}$) (e.g., about 50 Angstroms), as illustrated in FIG. 10. According to one exemplary aspect of the present invention, the thickness of the blocking layer 347 is chosen to enhance the ability to retard diffusion therethrough, yet thin enough to maintain favorable transistor operating characteristics. Therefore the blocking layer thickness may vary based on custom requirements, process thermal budget and the type of material used therein.

It is important to note that the blocking layer 347 does not block diffusion in the literal sense. Rather the layer 347 reduces the diffusion therethrough to the underlying layer. Therefore the layer 347 controls the diffusion of p-type dopants from the emitter poly down to the underlying epi. By slowing the diffusion through the blocking layer, the p-type dopants slow down, causing the dopants therein to build up and form a substantially abrupt junction. Therefore the blocking layer 347 becomes part of the emitter (often called the emitter-epi).

Figure 9:
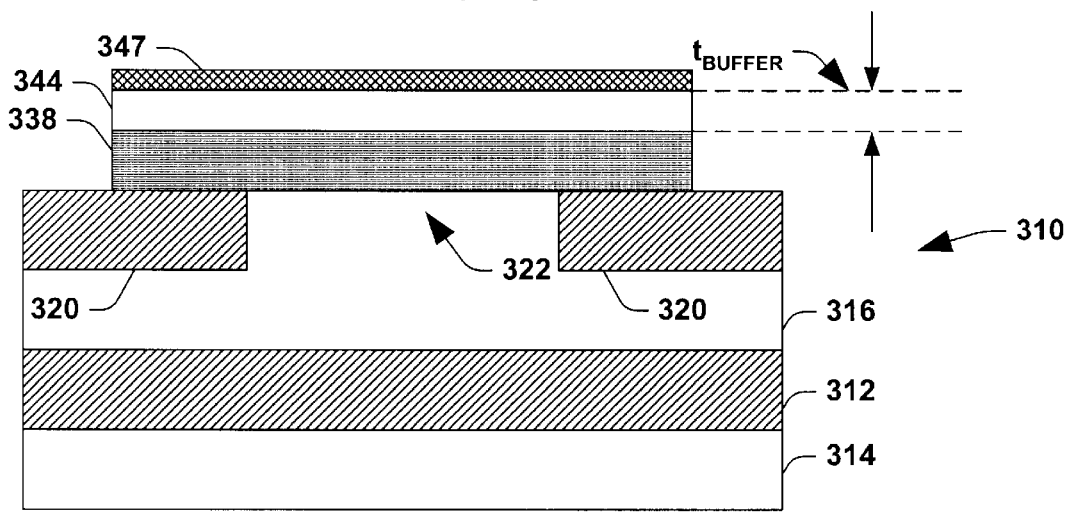
FIG. 9 is a fragmentary cross section diagram illustrating a step of forming a diffusion blocking layer and an intrinsic silicon buffer layer, if needed, according to the present invention.

In accordance with one exemplary aspect of the present invention, the introduction of the blocking material source gas may be introduced after a predetermined delay, during which time an intrinsic Si buffer layer 344 may be formed over the SiGe graded profile base layer 338 as illustrated in FIG. 9. Such a buffer layer 344 may be optional based on the efficacy of the subsequently formed diffusion blocking layer 347. That is, if the diffusion blocking layer 347 is operable to completely block all diffusion of p-type dopants such as boron therethrough, then no buffer layer 344 is necessary. However, if the blocking layer 347 instead is only operable to mitigate the diffusion, a nominal intrinsic Si buffer layer 344 may be employed and may be included by delaying a timing at which the blocking material source gas is introduced at step 342.

According to one exemplary aspect of the present invention, the blocking material source gas is discontinued and the Si source gas feed is maintained for another predetermined time to generate an intrinsic Si layer 348 at step 349 over the diffusion blocking layer 344, as illustrated in FIG. 10 having a predetermined thickness (e.g., about 45 Angstroms). As will be described in greater detail infra, the Si layer 348 will subsequently be consumed, but will help facilitate a low resistance emitter/base interface.

After steps 330 and 332 are completed, an emitter/base epi region layer having an alloy concentration which varies therethrough is achieved. For example, the concentration may be similar to that illustrated in FIG. 11. As can be seen from FIG. 11, a concentration profile 350 is illustrated, wherein a germanium concentration 352 in the SiGe base layer (e.g., layer 214 of FIG. 2 or layer 338 of FIG. 10) varies as one traverses from the collector toward the emitter. Note that at one side 354 near the collector, the Ge concentration rises rapidly to a maximum 356 at a thickness of about 100 Angstroms and then gradually decreases over the next 600 Angstroms to form a generally trapezoidal shaped graded profile. Another region 358 then exists which corresponds to the intrinsic Si buffer layer 216 of FIG. 2 or 344 of FIG. 10. This buffer layer in accordance with one exemplary aspect of the present invention is about 200 Angstroms thick, but this thickness may decrease or be eliminated altogether based on an effectiveness of the diffusion blocking layer.

Figure 11:
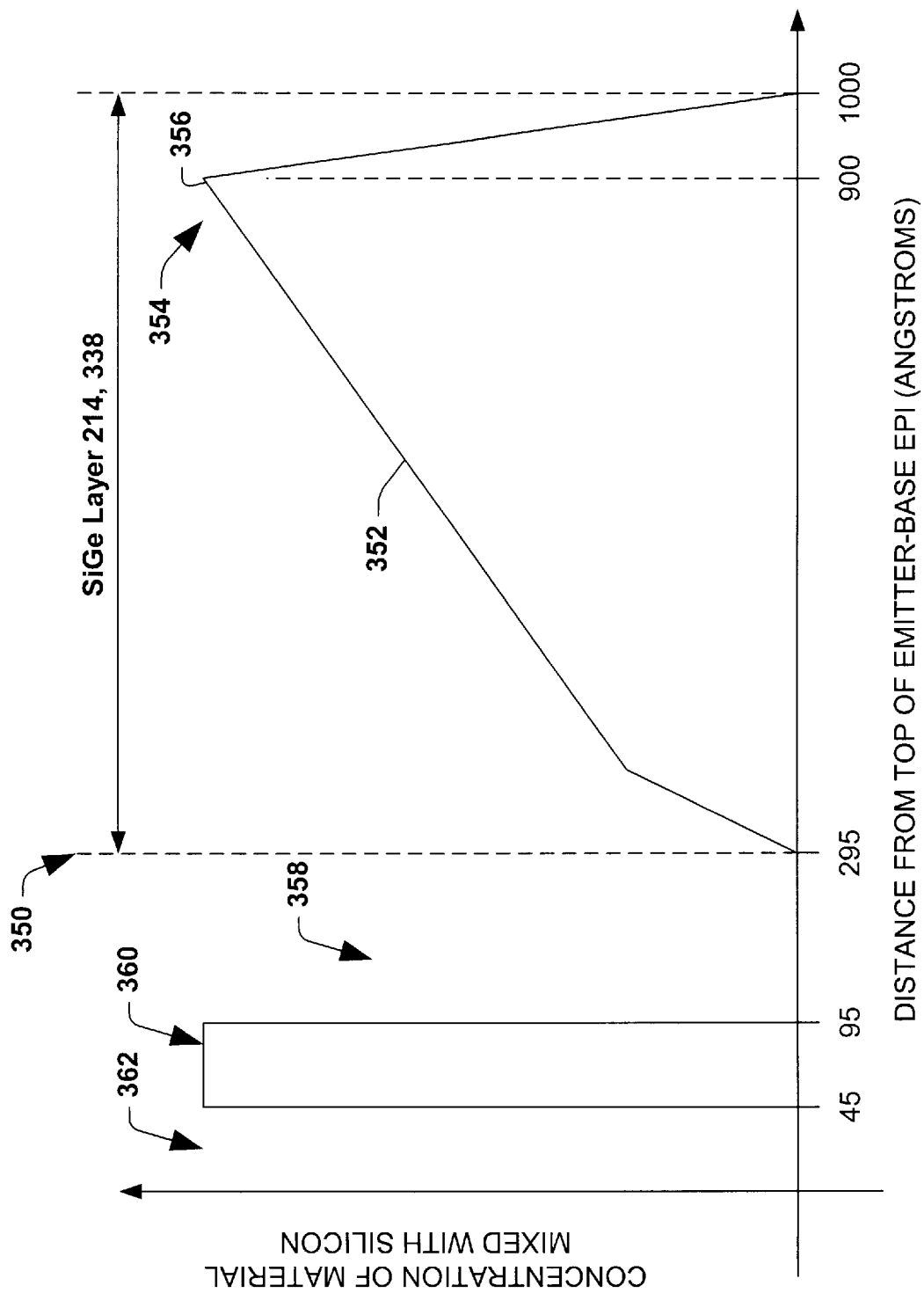
FIG. 11 is a graph illustrating a concentration profile associated with the base region of he heterojunction bipolar transistor according to one exemplary aspect of the present invention.

The concentration profile of FIG. 11 also has another impurity concentration region 360 which corresponds to the diffusion blocking layer (e.g., layer 218 of FIG. 2 or layer 347 of FIG. 10). For example, the impurity may be carbon or other materials which operate to retard the diffusion of p-type dopants therethrough. As illustrated in FIG. 11, the thickness of the diffusion blocking layer may be about 50 Angstroms. Lastly, the concentration profile of FIG. 11 illustrates an intrinsic Si region 362 at a top portion of the emitter/base layer, which operates as an interface to the emitter region. As will be discussed in greater detail infra, this region 362 will subsequently be consumed in the formation of the emitter contact region to minimize the emitter resistance associated with the transistor. In addition, it should be noted that subsequent processing will cause diffusion from the emitter into the diffusion blocking layer such that the blocking layer becomes part of the emitter (often called the emitter-epi region) such that the depletion region advantageously forms therein during transistor operation.

Figure 12:
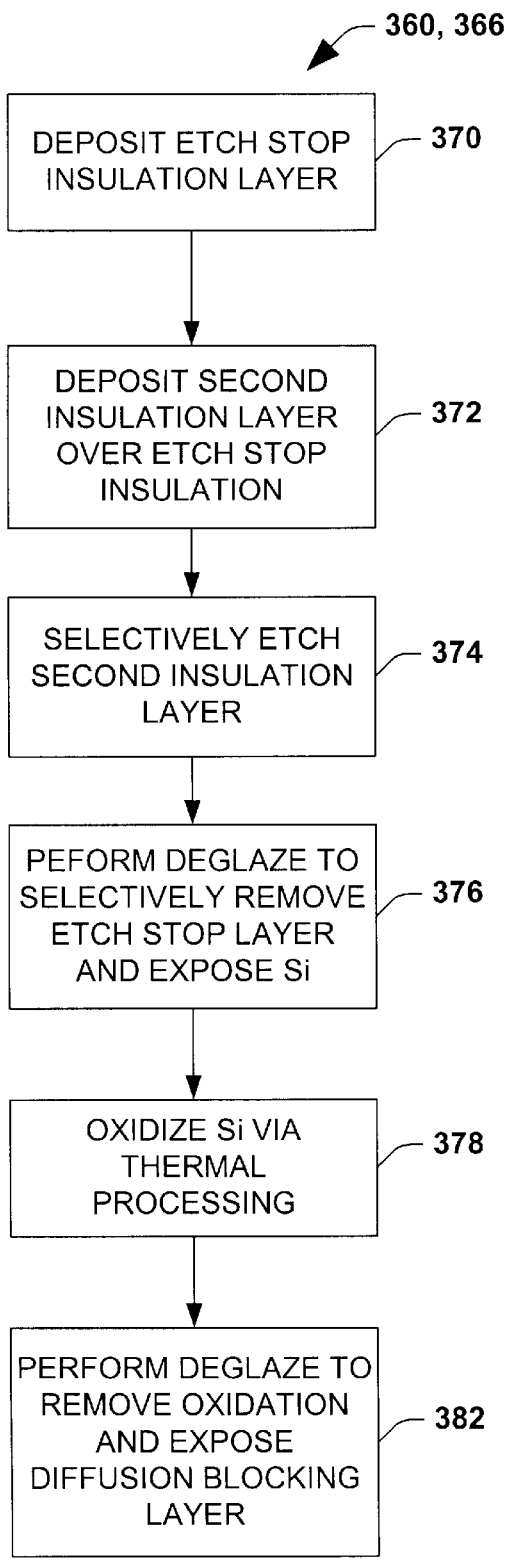
FIG. 12 is a flow chart diagram illustrating a method of forming an isolation region and defining an emitter contact region therein according to the present invention.
Figure 13:
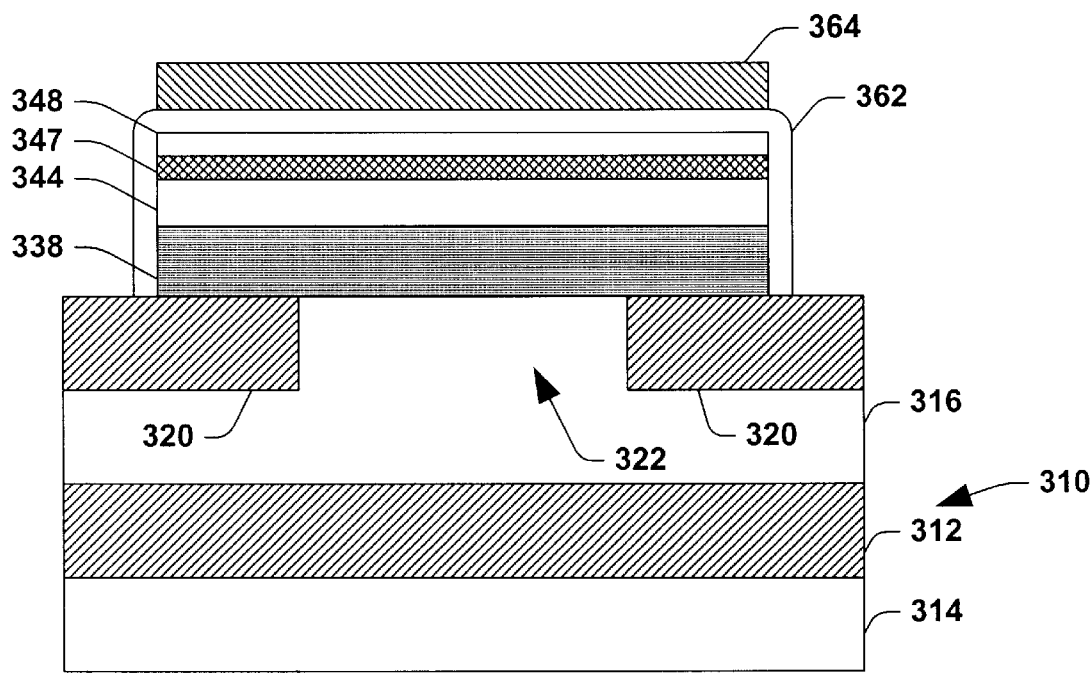
FIG. 13 is a fragmentary cross section diagram illustrating the isolation region overlying the emitter/base epi region of the transistor according to the present invention.
Figure 14:
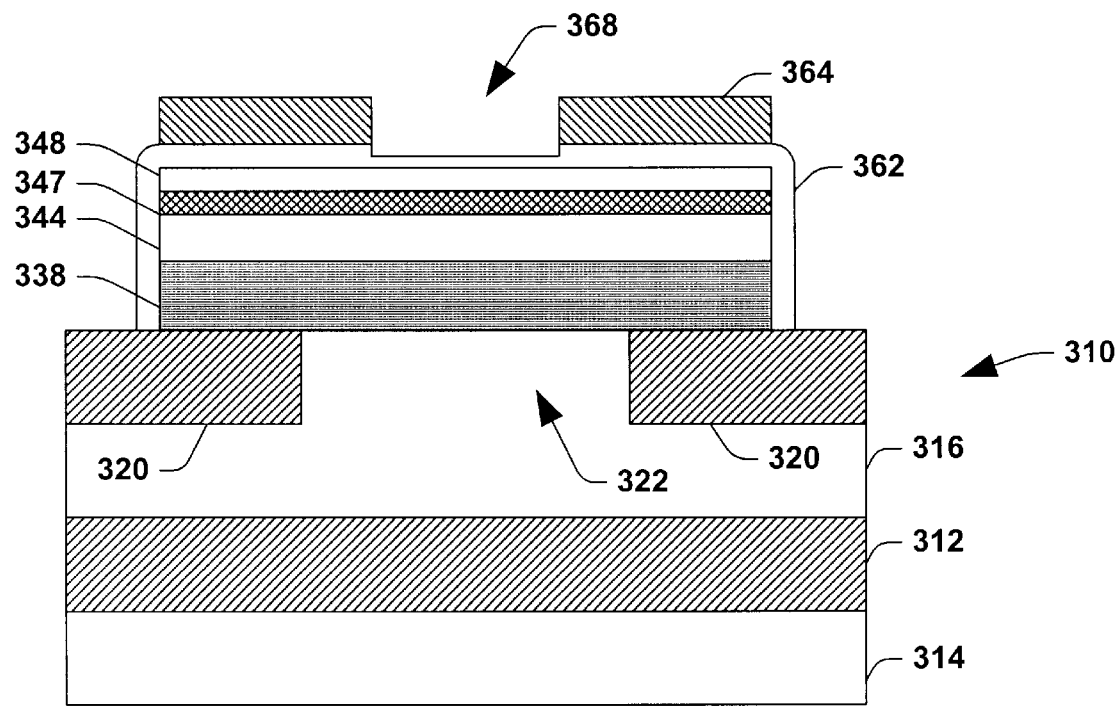
FIG. 14 is a fragmentary cross section diagram illustrating a selective etching of a nitride region using an underlying oxide layer as an etch stop according to the present invention.

Returning to FIG. 3, the method 300 continues at step 360 by forming isolation over the diffusion blocking layer 347 (and Si layer 348 of FIG. 10) and defining an emitter contact region therein at step 366. The steps 360 and 366 according to one exemplary aspect of the present invention will be described in conjunction with FIGS. 12–17. According to one exemplary aspect of the present invention, step 360 may comprise forming a pad oxide adhesion layer 362 as an etch stop layer (step 370 in FIG. 12) via, for example, oxide growth in a furnace and depositing a silicon nitride layer 364 thereover at step 372, as illustrated in FIG. 13. An emitter contact region is then defined at step 374 by selectively etching through the nitride layer 364, using the underlying oxide layer 362 as an etch stop as illustrated in FIG. 14. That is, the etch is selective with respect to the oxide such that an overetch may be utilized to ensure complete removal of the nitride in region 368 without substantial concern of etching through the oxide layer 364.

Figure 15:
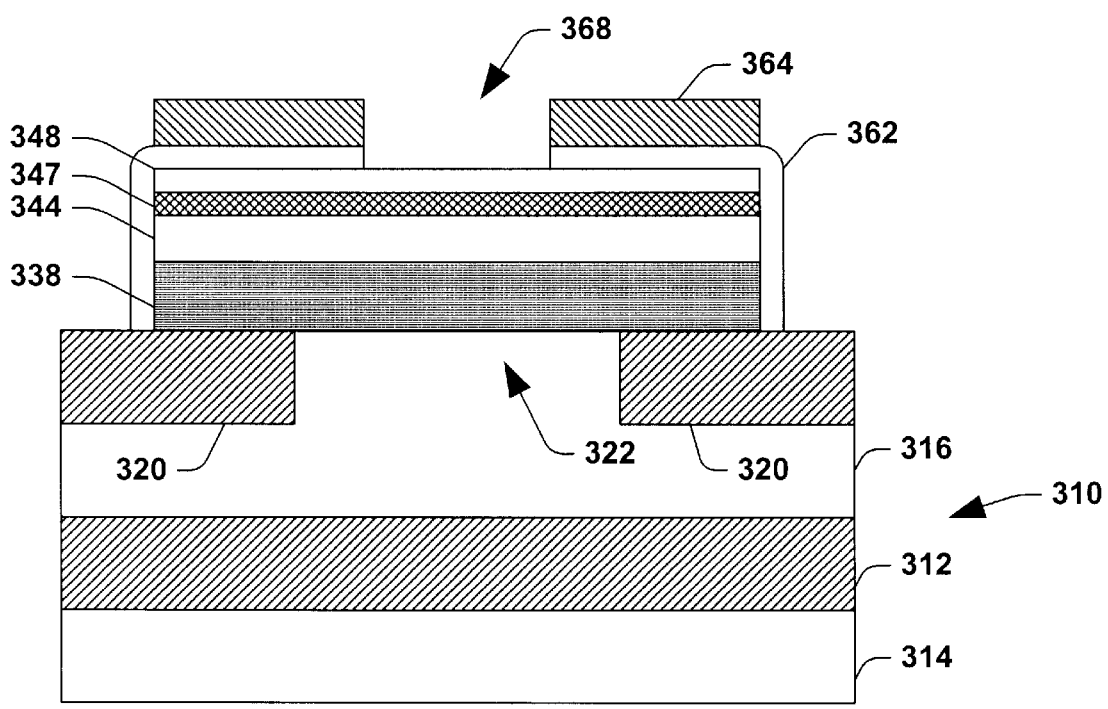
FIG. 15 is a fragmentary cross section diagram illustrating a deglaze step by which a portion of an oxide region is removed to expose an underlying intrinsic silicon layer according to the present invention.
Figure 16:
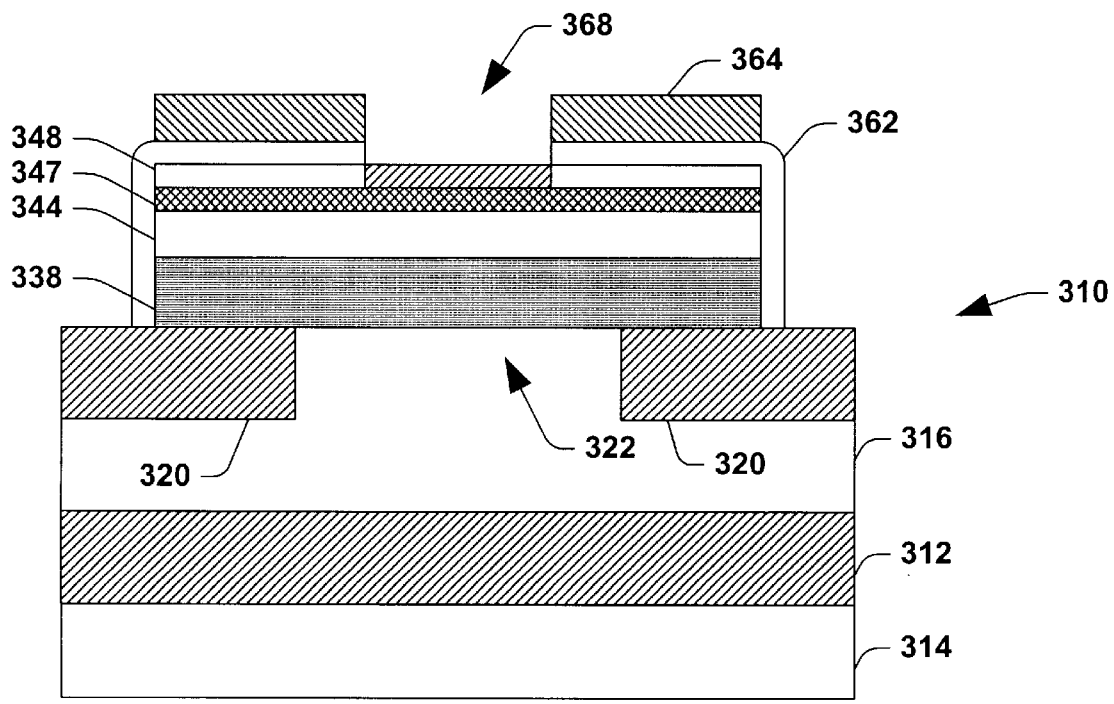
FIG. 16 is a fragmentary cross section diagram illustrating an oxidation of the exposed intrinsic silicon layer to form an oxide according to the present invention.
Figure 17:
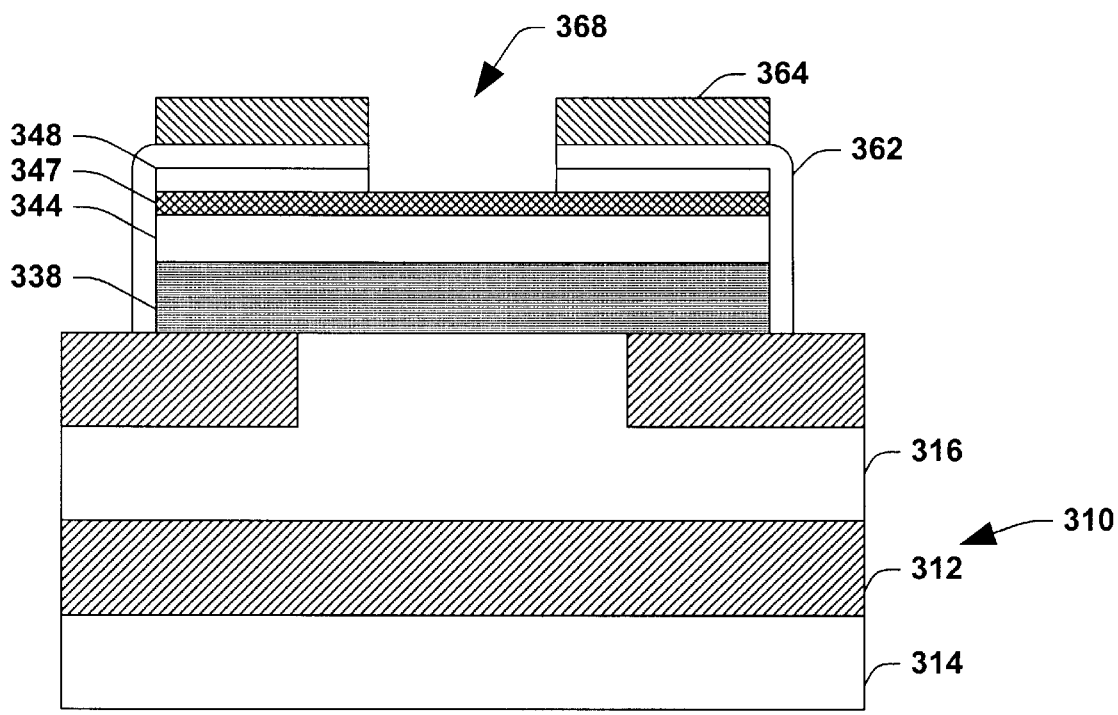
FIG. 17 is a fragmentary cross section diagram illustrating another deglaze step by which the oxide region is removed to expose an underlying diffusion blocking layer which is substantially resistant to oxidation according to the present invention.

Step 366 continues at step 376 by performing a deglaze step to remove the exposed silicon oxide which still remains after the nitride removal. The deglaze may comprise a wet HF etchant solution which removes the oxide in the region 368 to expose the underlying intrinsic silicon layer 348, as illustrated in FIG. 15, however, other processes and/or etchants may be employed and are contemplated as falling within the scope of the present invention. The exposed silicon layer 348 is then oxidized at step 378 via, for example, thermal processing to generate a silicon dioxide region 380, as illustrated in FIG. 16 in region 368. The silicon dioxide region 380 is then removed by another deglaze step 382 to thereby expose the underlying diffusion blocking layer 347 (e.g., SiC), as illustrated in FIG. 17. Because the diffusion blocking layer 347 is substantially less susceptible to oxidation, a substantially lower resistance emitter/base interface may be formed, thereby further improving the transistor performance over the prior art.

Figure 18:
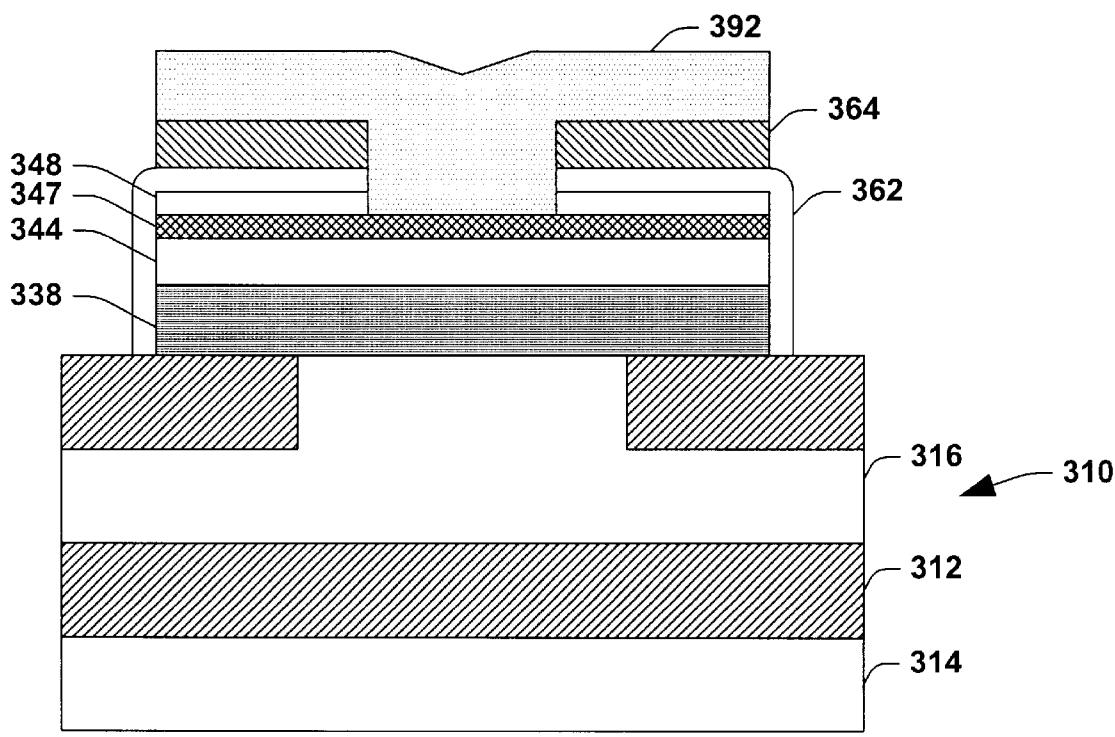
FIG. 18 is a fragmentary cross section diagram illustrating a doped polysilicon emitter region formed over the transistor, wherein the dopant from the emitter does not substantially diffuse through the diffusion blocking layer, thereby allowing the effective emitter/base epitaxy thickness to be reduced according to the present invention.

Returning to FIG. 3, the method 300 continues at step 390 by forming an emitter polysilicon region 392 over the defined emitter contact region, as illustrated in FIG. 18. For example, a polysilicon layer may be deposited via CVD and doped with a p-type dopant such as boron (either in-situ or in a subsequent implantation step). The implanted dopant is then diffused through the polysilicon into the base/emitter epi layer via a thermal processing step. The p-type dopant, however, does not diffuse substantially through the diffusion blocking layer 347, thereby allowing an underlying intrinsic Si buffer layer 344 to be substantially minimized or eliminated altogether.

As discussed above, the method 300 of the present invention provides for the fabrication of a PNP heterojunction bipolar transistor structure, which enables a reduction in the emitter/base epi thickness and an increase in the peak Ge concentration in the graded profile base layer. The position of the emitter p-n junction is well controlled, providing greater process margin. Higher diffusion temperatures may be used to achieve the desired dopant profile at a higher boron dopant activation. Also, the emitter side of the depletion region is more abrupt therefore yielding a device which has significantly higher gain. In addition, the method 300 provides for a reduced emitter resistance over the prior art by eliminating an interfacial oxide at the emitter/base interface.

It should be understood that the above aspects of the present invention are not limited to heterojunction bipolar transistor structures, but rather they apply to any form of PNP transistor structure where p-type dopants such as boron diffuse from the emitter poly into the emitter/base epi. Therefore a traditional PNP transistor structure may employ a diffusion blocking layer as highlighted above, and such a structure is contemplated as falling within the scope of the present invention. In addition, it should be understood that the method of the present invention may be employed within a complimentary bipolar transistor process without impacting adversely the formation of NPN type transistors. Incorporation of the above aspects of the invention into such a complimentary bipolar process is contemplated as falling within the scope of the present invention.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of forming a heterojunction bipolar transistor, comprising the steps of:
    forming a collector region associated with a semiconductor substrate;
    forming a graded profile base region over at least a portion of the collector region;
    forming a diffusion blocking layer over the graded profile base region, wherein the graded profile base region and the diffusion blocking layer define an emitter/base region; and
    forming an emitter region over the diffusion blocking layer, wherein the diffusion blocking layer reduces an amount of diffusion from the emitter region into the graded profile base region, and wherein a diffusion into the diffusion blocking layer causes the diffusion blocking layer to become part of the emitter region.

2. The method of claim 1, wherein forming the collector region comprises:
    forming a buried oxide layer in the semiconductor substrate, thereby separating the semiconductor substrate into a bottom substrate region below the buried oxide layer and a collector region above the buried oxide layer; and
    forming two laterally spaced, shallow trench isolation regions in the collector region, thereby defining an interface surface to the graded profile base region.

3. The method of claim 1, wherein forming the graded profile base region portion of the emitter/base region comprises:
    initiating a chemical vapor deposition processing using a silicon gas source and a germanium gas source; and
    dynamically adjusting the silicon gas source and the germanium gas source to adjust a ratio of silicon gas to germanium gas, thereby varying a germanium concentration in a resulting silicon-germanium alloy which forms the graded profile base region.

4. The method of claim 1, wherein the diffusion blocking layer comprises a silicon-carbon alloy.

5. The method of claim 4, wherein the silicon-carbon alloy comprises $Si_{(1-X)}C_X$, wherein X varies between about 0.0001 and about 0.01.

6. The method of claim 4, wherein forming the diffusion blocking layer comprises:
    initiating a chemical vapor deposition processing using a silicon gas source and a carbon gas source; and
    dynamically adjusting the silicon gas source and the carbon gas source to adjust a ratio of silicon gas to carbon gas, thereby varying a carbon concentration in the resulting silicon-carbon alloy which forms the diffusion blocking layer.

7. The method of claim 1, wherein forming the emitter region comprises:
    forming an isolation layer over the diffusion blocking layer;
    selectively etching the isolation layer to expose a portion of the diffusion blocking layer;
    depositing a polysilicon layer over the etched isolation layer, thereby contacting the exposed portion of the diffusion blocking layer;
    doping the polysilicon layer with boron; and
    performing a thermal processing to diffuse the boron through the polysilicon into the diffusion blocking layer portion of the emitter/base region, thereby forming a portion of the emitter region, wherein the diffusion blocking layer substantially reduces a diffusion of boron therethrough to the graded profile base region, thereby allowing a reduction in a thickness of the emitter/base base region.

8. The method of claim 7, wherein forming the isolation layer comprises:
    forming an oxide layer over the diffusion blocking layer; and
    forming a nitride layer over the oxide layer.

9. The method of claim 8, wherein selectively etching the isolation region comprises:
    etching a portion of the nitride layer with an etchant which is selective with respect to oxide, wherein the oxide layer serves as an etch stop; and
    deglazing an exposed portion of the oxide layer, thereby exposing the portion of the diffusion blocking layer.

10. The method of claim 9, further comprising the steps:
    subjecting the transistor to an oxidation step, thereby causing any silicon on the exposed portion of the diffusion blocking layer to oxidize; and
    deglazing any oxidized silicon on the exposed portion of the diffusion blocking layer.

11. A method of forming a PNP heterojunction bipolar transistor, comprising the steps of:
    forming a p-type collector region in a substrate;
    forming an n-type emitter/base epitaxy region over the collector region, wherein the emitter/base epitaxy region comprises:
        a SiGe graded profile region having a generally trapezoidal germanium concentration profile associated therewith, wherein a germanium concentration near the collector region is a substantially high concentration of about 20%, and then steadily declines to about 1% as a distance from the collector region increases;

a silicon region overlying the SiGe graded profile region;

a diffusion blocking region overlying the silicon region, wherein the diffusion blocking layer comprises an SiX alloy, wherein X comprises a material which retards a diffusion of a p-type dopant through the SiX;

forming a p-type emitter poly region over the emitter/base epitaxy region, wherein a diffusion of p-type dopant from the emitter poly region down to the SiGe graded profile region is substantially inhibited by the diffusion blocking region, thereby allowing for a thickness reduction in the emitter/base epitaxy region.

12. The method of claim 11, wherein SiX comprises SiGe.

13. The method of claim 11, wherein SiX comprises an SiC alloy.

14. The method of claim 13, wherein SiC alloy comprises $Si_{(1-Y)}C_Y$, wherein Y varies between about 0.0001 and about 0.01.

* * * * *